United States Patent
Saitoh

(10) Patent No.: US 9,491,843 B2
(45) Date of Patent: Nov. 8, 2016

(54) CIRCUIT BOARD AND DISPLAY DEVICE USING THE SAME

(71) Applicant: Japan Display Inc., Minato-ku (JP)

(72) Inventor: Akihiko Saitoh, Tokyo (JP)

(73) Assignee: Japan Display Inc., Minato-ku (JP)

( * ) Notice: Subject to any disclaimer, the term of this patent is extended or adjusted under 35 U.S.C. 154(b) by 395 days.

(21) Appl. No.: 14/029,922

(22) Filed: Sep. 18, 2013

(65) Prior Publication Data

US 2014/0104804 A1    Apr. 17, 2014

(30) Foreign Application Priority Data

Oct. 15, 2012   (JP) ................ 2012-227768

(51) Int. Cl.
| | | |
|---|---|---|
| G02F 1/1345 | (2006.01) |
| H05K 1/02 | (2006.01) |
| H05K 1/11 | (2006.01) |
| H05K 3/40 | (2006.01) |

(52) U.S. Cl.
CPC ............. *H05K 1/02* (2013.01); *G02F 1/13458* (2013.01); *H05K 1/111* (2013.01); *H05K 3/4007* (2013.01)

(58) Field of Classification Search
CPC .............................. H05K 1/02; G02F 1/13458
See application file for complete search history.

(56) References Cited

U.S. PATENT DOCUMENTS

2004/0238825 A1* 12/2004 Lim .................. G02F 1/13458
                                                                257/79

FOREIGN PATENT DOCUMENTS

| JP | H11-024094 A | 1/1999 |
| JP | 2001-174844 A | 6/2001 |
| JP | 2005-43804 | 2/2005 |
| JP | 2005-150105 A | 6/2005 |
| JP | 2007-213065 A | 8/2007 |

OTHER PUBLICATIONS

Japanese Office Action dated Jul. 19, 2016, issued in Japanese Patent Application No. 2012-227768 (with English translation).

* cited by examiner

*Primary Examiner* — James Dudek
(74) *Attorney, Agent, or Firm* — Oblon, McClelland, Maier & Neustadt, L.L.P.

(57) ABSTRACT

A circuit board includes an insulating film extending from an active area for displaying images to a peripheral area surrounding the active area. A circumference wiring is arranged in an aperture penetrating the insulating film and extending from the aperture to the active area on the insulating film so as to cross an edge of the aperture. The shape of the edge of the aperture which the circumference wiring crosses includes at least one concave portion and one convex portion, respectively.

15 Claims, 6 Drawing Sheets

CIRCUIT BOARD AND DISPLAY DEVICE USING THE SAME

CROSS-REFERENCE TO RELATED APPLICATION

This application is based upon and claims the benefit of priority from prior Japanese Patent Application No. 2012-227768 filed Oct. 15, 2012, the entire contents of which are incorporated herein by reference.

FIELD

Embodiments described herein relate generally to a circuit board and a display device using the circuit board.

BACKGROUND

A display panel such as a liquid crystal display device and an organic electroluminescence display panel (EL) is used in various fields of OA equipments such as a personal computer and a television set, taking advantage of the features such as light weight, thin shape, and low power consumption. In recent years, the display panel is also used as display devices for a portable remote terminal such as a cellular phone and PDA (personal digital assistant), a car navigation equipment, and a game machine.

The display panel is equipped with gate lines and source lines in an active area which displays images. A signal source for supplying signals required to display the images is mounted in a peripheral area outside the active area. The gate lines and source lines are pulled out to the peripheral area and electrically connected with a pad in which the signal source is mounted.

As a structure of a terminal for mounting the signal source, a structure which laminates a metal layer and a transparent electric conductive layer is known.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

Figure 1:
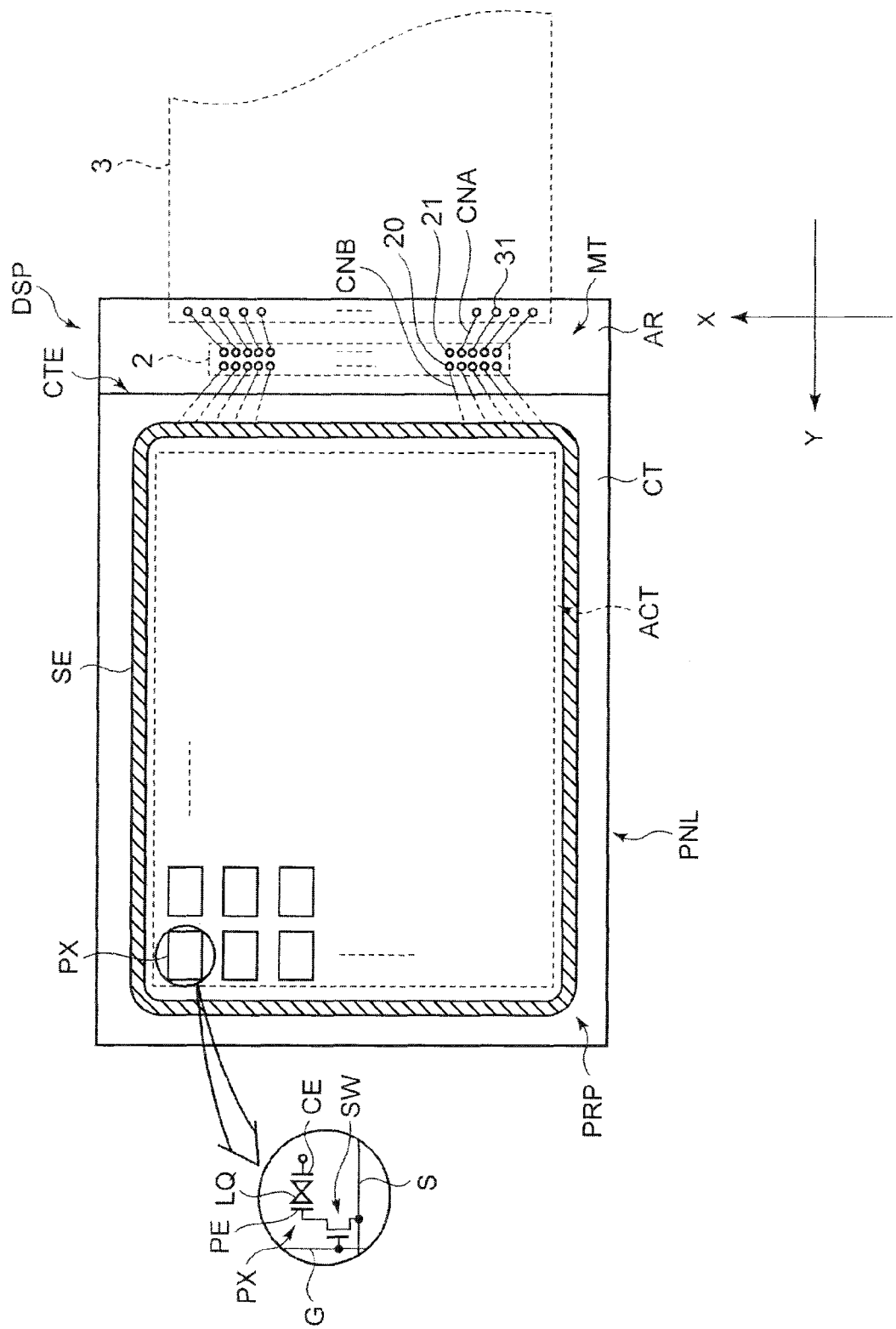
FIG. 1 is a plan view schematically showing a display device DSP equipped with a circuit board according to one embodiment.

A liquid crystal display device according to an exemplary embodiment of the present invention will now be described with reference to the accompanying drawings wherein the same or like reference numerals designate the same or corresponding portions throughout the several views.

According to one embodiment, a circuit board includes: an insulating film extending from an active area for displaying images to a peripheral area surrounding the active area; and a circumference wiring arranged in an aperture penetrating the insulating film and extending from the aperture to the active area on the insulating film so as to cross an edge of the aperture in the peripheral area; wherein the edge of the aperture which the circumference wiring crosses includes at least one concave portion and one convex portion, respectively.

According to other embodiment, a circuit board includes: an insulating film extending from an active area for displaying images to a peripheral area surrounding the active area; and a circumference wiring arranged in an aperture penetrating the insulating film and extending from the aperture to the active area on the insulating film crossing an edge of the aperture in the peripheral area; wherein the edge of the aperture which the circumference wiring crosses is formed so as to extend in a different direction from both an extending direction of the circumference wiring and a direction crossing the extending direction of the circumference wiring orthogonally.

According to other embodiment, a display device includes: a circuit board including; a first inter-layer insulating film extending from an active area for displaying images to a peripheral area surrounding the active area, a gate line formed on the first inter-layer insulating film in the active area, a second inter-layer insulating film covering the first inter-layer insulating film and the gate line, a source line formed on the second inter-insulating film in the active area, and a circumference wiring arranged in an aperture penetrating the first and second inter-insulating films and extending from the aperture to the active area on the second inter-layer insulating film so as to cross an edge of the aperture, and a counter substrate facing the circuit board and including a substrate end located in a position where the circumference wiring cross the edge of the aperture; wherein the shape of the edge of the aperture which the circumference wiring crosses includes at least one concave portion and one convex portion, respectively.

FIG. 1 is a plan view schematically showing a display device DSP equipped with a circuit board according to one embodiment.

Although the display device DSP illustrated here is a liquid crystal display device equipped with an active-matrix type liquid crystal display panel as the display panel PNL, it may be an organic electroluminescence (EL) display device equipped with the organic electroluminescence (EL) display panel. The circuit board according to this embodiment corresponds to an array substrate AR of the illustrated display panel PNL, for example.

The display panel PNL is equipped with the array substrate AR and a counter substrate CT arranged facing the array substrate AR, and a liquid crystal layer LQ held therebetween. The array substrate AR and the counter substrate CT are pasted together by a seal element SE while forming a predetermined cell gap between the substrates. The cell gap is formed of a pillar-shaped spacer which is formed on the array substrate AR or the counter substrate CT (not illustrated). The liquid crystal layer LQ is held on the inner side surrounded with the seal element SE in the cell gap between the array substrate AR and the counter substrate CT.

The display panel PNL is equipped with an active area ACT which displays images on the inner side surrounded with the seal element SE. The active area ACT is formed of a plurality of pixels PX in a rectangular shape by being arranged in the shape of a (m×n) matrix, for example (here, m and n are positive integers).

The array substrate AR is equipped with a plurality of gate lines G extending along a first direction X, a plurality of source line S extending along a second direction Y orthogonally crossing the first direction X, a switching element SW connected with the gate line G and the source line S and a pixel electrode PE connected with the switching element SW, etc. Although the counter substrate CT is equipped with a counter electrode CE which faces each of the pixel electrodes PE through the liquid crystal layer LQ, for example, the array substrate AR may be equipped with the counter electrode CE.

In addition, although explanation is omitted about detailed structures of the display panel PNL, the display panel PNL is constituted so that modes which mainly use vertical electric field or oblique electric field, such as TN (Twisted Nematic) mode, OCB (Optically Compensated Bend) mode, and VA (Vertical Aligned) mode are applicable. Further, modes which mainly use lateral electric field, such as IPS (In-Plane Switching) mode and FFS (Fringe Field Switching) mode may be applicable by arranging the pixel electrode PE and the counter electrode CE on the array substrate AR.

The signal source for supplying signals required to drive the display panels PNL, such as a driving IC chip 2 and a flexible printed circuit (FPC) board 3, is arranged in the peripheral area PRP outside the active area ACT. More specifically, the array substrate AR is equipped with a mounting portion MT which extends outside along a second direction Y beyond a substrate end CTE of the counter substrate CT. The mounting portion MT includes a plurality of input pads 21 and output pads 20 in a position where the driving IC chip 2 is mounted. Moreover, the mounting portion MT includes a plurality of input pads 31 in a position where the FPC board 3 is mounted. The input pad 31 and the input pad 21 are connected by the connection wiring CNA, respectively. The gate line G, various wirings in the active area ACT, such as the source line S and the output pad 20 are connected with the circumference wiring CNB, respectively. The substrate end CTE extends in a direction which intersects the circumference wiring CNB, and is located above the circumference wiring CNB.

Figure 2:
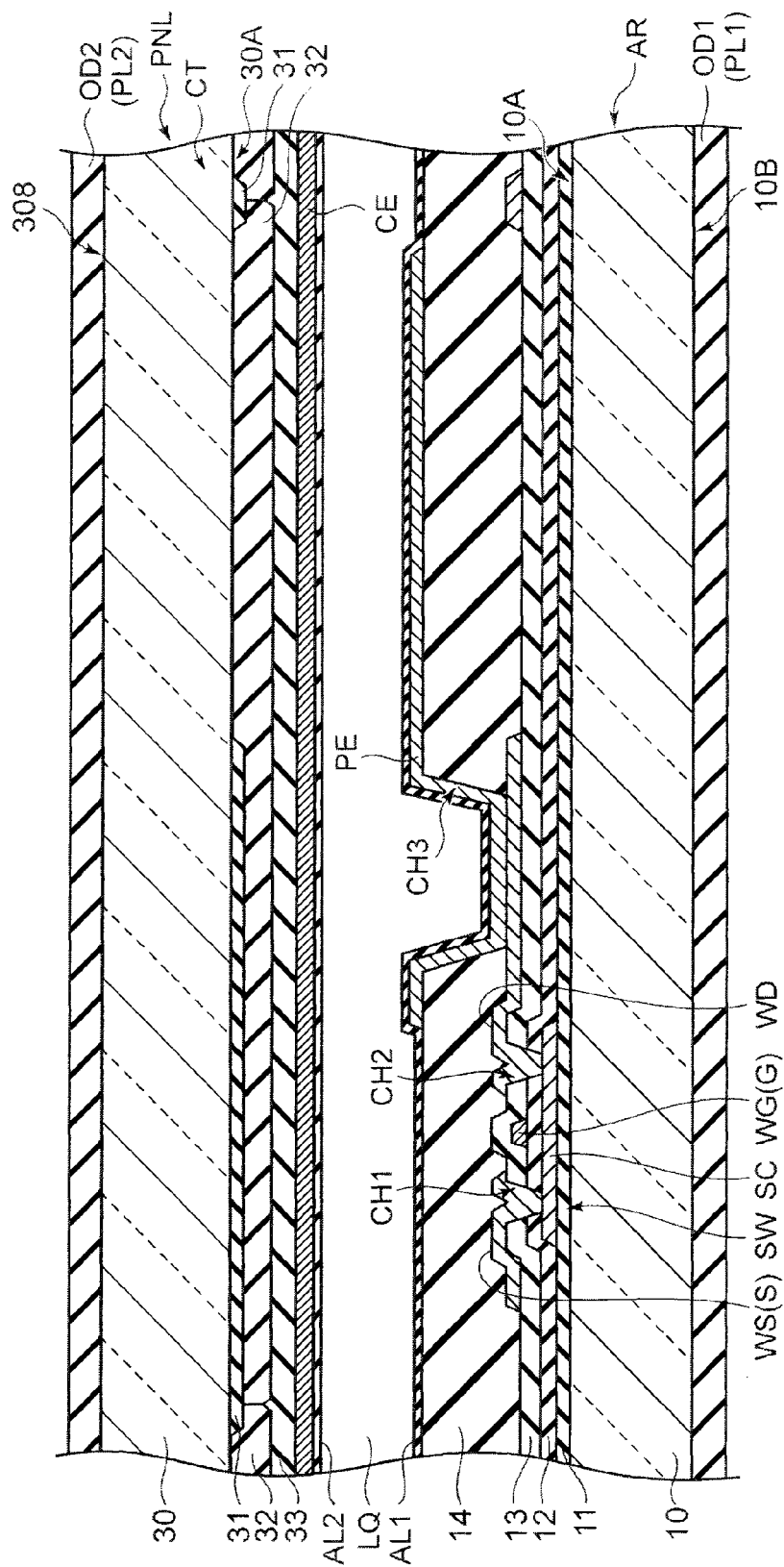
FIG. 2 is a plan view schematically showing a structure of an active area of a display panel PNL shown in FIG. 1.

FIG. 2 is a plan view schematically showing a structure of the active area of the display panel PNL shown in FIG. 1. Here, the structure corresponding to the mode using the vertical electric field is explained as one example of the display panel PNL.

The array substrate AR is formed using a first insulating substrate 10 formed of a glass substrate, etc., which has transmissive characteristics. This array substrate AR includes a switching element SW, a pixel electrode PE, a first insulating film 11, a second insulating film 12, a third insulating film 13, a fourth insulating film 14, and a first alignment film AL1, etc., on the first insulating substrate 10 facing the counter substrate CT.

The first insulating film 11 is formed of an undercoat layer, and covers an inside 10A of the first insulating substrate 10. The first insulating film 11 is formed with a silicon oxide (SiOx) or a silicon nitride (SiNx), or formed with a laminated layer of the silicon oxide layer and the silicon nitride layer.

The switching element SW shown here is formed of a thin film transistor (TFT) of a top-gated type. The switching element SW is equipped with a semiconductor layer SC arranged on the first insulating film 11. The semiconductor layer SC is formed with poly-silicon, for example. The semiconductor layer SC is covered with the second insulating film 12. Moreover, the second insulating film 12 also covers the first insulating film 11. The second insulating film 12 corresponds to a first interlayer-insulating film.

A gate electrode WG of the switching element SW is formed on the second insulating film 12, and is located right above the semiconductor layer SC. The gate electrode WG is electrically connected with the gate line G or formed integrally with the gate line G. The gate line G including the gate electrode WG is covered with the third insulating film 13. The third insulating film 13 also covers the second insulating film 12. The third insulating film 13 corresponds to a second interlayer-insulating film. The second insulating film 12 and the third insulating film 13 are formed with the silicon oxide or the silicon nitride.

A source electrode WS and a drain the electrode WD of the switching element SW are formed on the third insulating film 13. The source electrode WS is electrically connected with a source line S or integrally formed with the source line S. The drain electrode WD is arranged apart from the source line S. The source electrode WS is in contact with the semiconductor layer SC through a contact hole CH1 which penetrates the second insulating film 12 and the third insulating film 13. The drain electrode WD is in contact with the semiconductor layer SC through a contact hole CH2 which penetrates the second insulating film 12 and the third insulating film 13. The source electrode WS and the drain electrode WD are covered with the fourth insulating film 14. Moreover, the fourth insulating film 14 also covers the third insulating film 13. The fourth insulating film 14 is formed of resin material, for example.

The pixel electrode PE is formed on the fourth insulating film 14, and in contact with the drain electrode WD through a contact hole CH3 which penetrates the fourth insulating film 14. The pixel electrode PE is formed of transparent electric conductive materials, such as Indium Tin Oxide (ITO) and Indium Zinc Oxide (IZO), for example. The pixel electrode PE is covered with a first alignment film AL1.

On the other hand, the counter substrate CT is formed using a second insulating substrate 30 which has light transmissive characteristics such as a glass substrate, etc. The counter substrate CT is equipped with a shield layer 31, a color filter 32, an overcoat layer 33, a common electrode CE, and a second alignment AL2, etc., formed on a second transparent insulating substrate 30 such as a glass substrate facing the array substrate AR.

A shield layer 31 is formed in the inside 30A of the second insulating substrate 30, and defines each pixel PX in the active area ACT. The shield layer 31 counters wiring portions, such as the gate line G, the source line S, and the switching element SW. The color filter 32 is formed on the inside 30A, and extends also on the shield layer 31. The color filter 32 is formed of a colored resin material, for example. The overcoat layer 33 covers the color filter 32. The overcoat layer 33 makes flat unevenness of the surface of the shield layer 31 and the color filter 32. The overcoat layer 33 is formed of a transparent resin material, for example. The common electrode CE is formed on the overcoat layer 33 facing the array substrate AR. The common electrode CE is formed of transparent electric conductive materials, such as ITO and IZO. The common electrode CE is covered with the second alignment film AL2.

The array substrate AR and the counter substrate CT as mentioned above are arranged so that the first alignment film AL1 and the second alignment film AL2 face each other. The liquid crystal layer LQ is formed of liquid crystal composite containing liquid crystal molecules injected into the cell gap formed between the first alignment film AL1 and the second alignment film AL2.

A first optical element OD1 including a first polarization plate PL1 is arranged on one external surface 10B of the array substrate AR, i.e., the external surface of the first insulating substrate 10. Moreover, a second optical element OD2 including a second polarization plate PL2 is arranged on the external surface 30B of the counter substrate, i.e., the external surface of the second insulating substrate 30.

Figure 3:
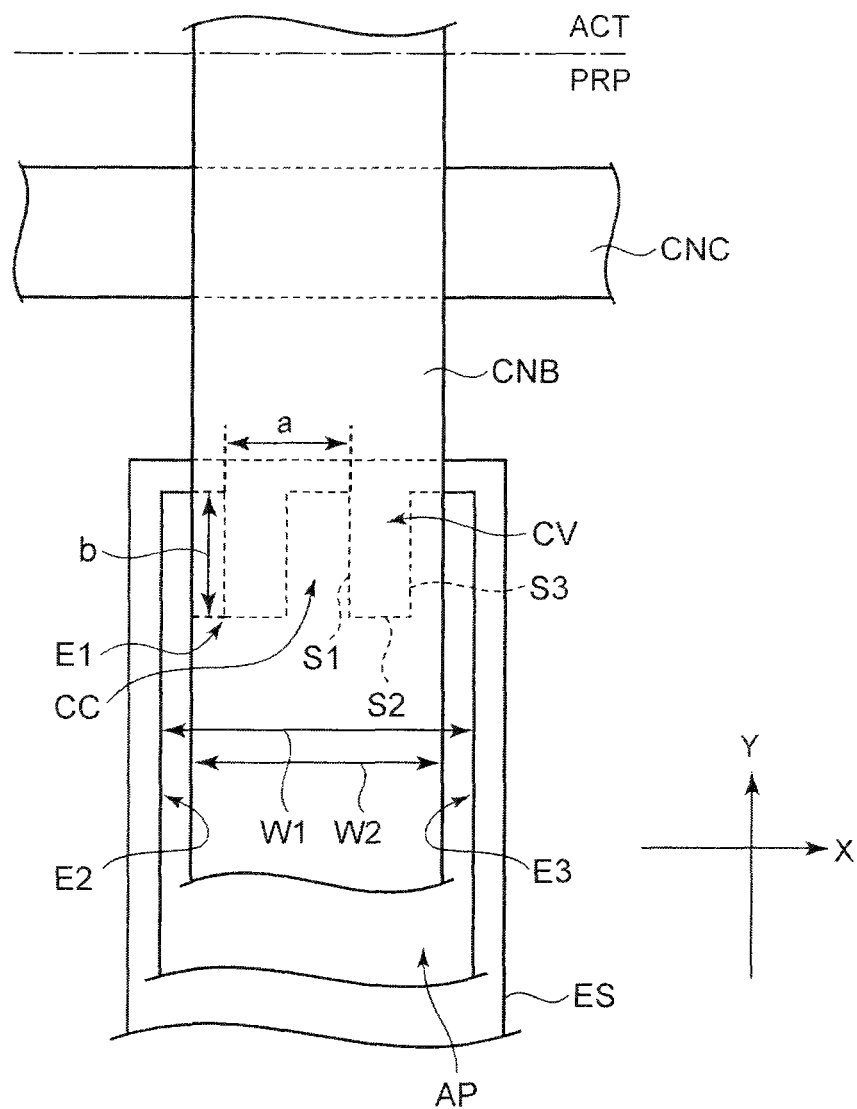
FIG. 3 is a plan view schematically showing a structure of a peripheral area in the display panel PNL shown in FIG. 1.

FIG. 3 is a plan view schematically showing a structure of a peripheral area in the display panel PNL shown in FIG. 1. Here, the structure of the circumference wiring CNB and its periphery is shown.

While the circumference wiring CNB is arranged at an aperture AP formed in the second insulating film 12 and the third insulating film 13 in the peripheral area PRP, the circumference wiring CNB extends toward the active area ACT on the third insulating film 13 from the aperture AP. In the illustrated example, the extending direction of the circumference wiring CNB is in parallel to the second direction Y, and intersects perpendicularly with the first direction X.

The aperture AP extends substantially in parallel to the extending direction of the circumference wiring CNB, i.e., the second direction Y. The aperture AP includes an edge E1 to which the circumference wiring CNB extends, i.e., which crosses the circumference wiring CNB, and an edge E2 and an edge E3 arranged in parallel to the extending direction of the circumference wiring CNB. Each of the edge E2 and the edge E3 is formed in the shape of an approximately straight line along the second direction Y, apart from the circumference wiring CNB. An etching stopper layer ES is arranged at a bottom of the aperture AP.

In the illustrated example, the edge E1 is formed in a nonlinear shape, and more specifically, in a com-like shape which has at least one concave portion CC and one convex portion CV, respectively. The circumference wiring CNB crosses the edge E1 so that the circumference wiring CNB covers at least one concave portion CC and one convex portion CV through the second and third insulating films 12 and 13, respectively. In the edge E1, when a concave-convex cycle is set to "a", depth of the concave portion CC (or height of the convex portion CV) is set to "b", and "b" is set to be equal to "a", the total extending distance of the edge E1 becomes three times longer as compared with a case where the edge E1 is a straight line shape. Moreover, when the length is set to b=4.5×"a", the total extending distance of the edge E1 becomes ten times longer as compared with the case where the edge E1 is the straight line shape.

In addition, in this embodiment, the circumference wiring CNC extends between the aperture AP and the active area ACT along the first direction X in the peripheral area PRP, and intersects the circumference wiring CNB. An insulating film which is not illustrated is arranged between the circumference wiring CNB and circumference wiring CNC.

Figure 4:
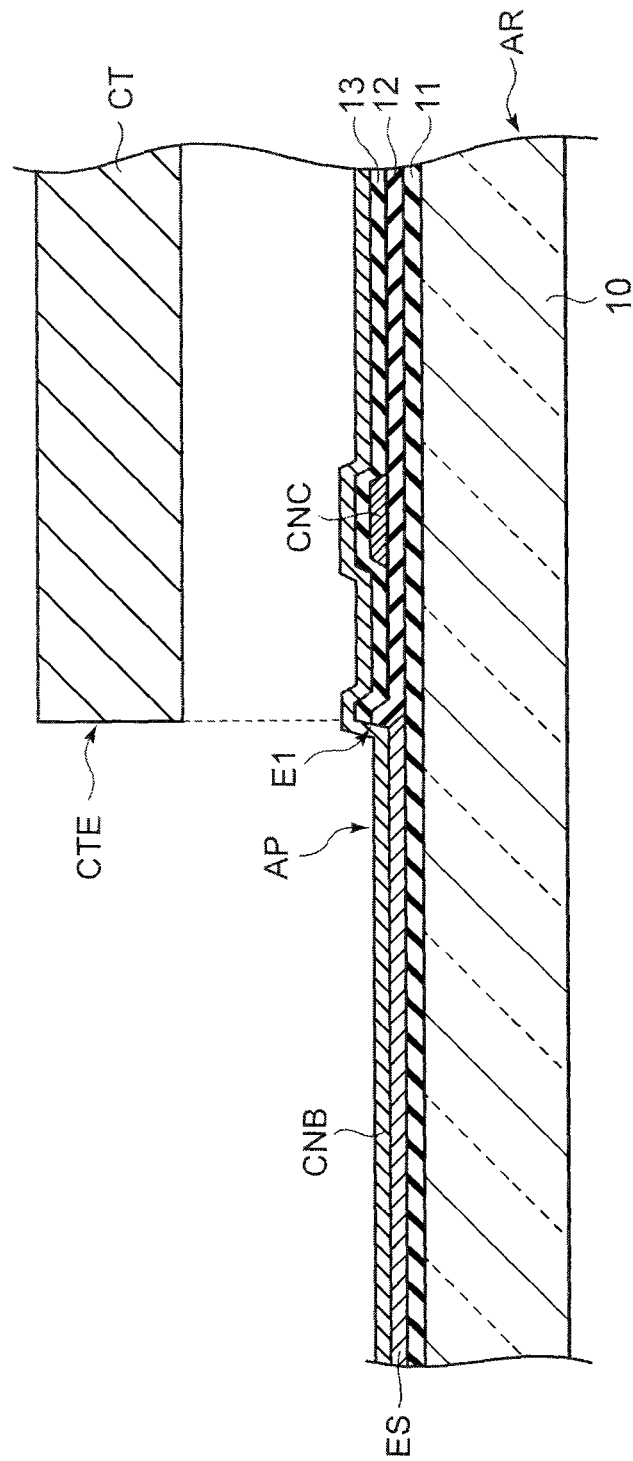
FIG. 4 is a cross-sectional view schematically showing a structure of the display panel PNL shown in FIG. 3 including a circumference wiring CNB.

FIG. 4 is a cross-sectional view schematically showing the structure of the display panel PNL including the circumference wiring CNB shown in FIG. 3.

The first insulating film 11, the second insulating film 12, and the third insulating film 13 extend from the active area ACT shown in FIG. 2 to the peripheral area PRP, respectively. The etching stopper layer ES is formed on the first insulating film 11 in the peripheral area PRP. The etching stopper layer ES is formed of the same material (for example, poly-silicon) as the semiconductor layer SC, and can be formed simultaneously with the semiconductor layer SC. The end of the etching stopper layer ES is covered with the second insulating film 12.

The aperture AP which penetrates the second insulating film 12 and the third insulating film 13 is located outside the substrate end CTE of the counter substrate CT, for example. The aperture AP can be formed at the same time as forming the contact holes CH1 and CH2.

The circumference wiring CNC is formed on the second insulating film 12 in the peripheral area PRP, and covered with the third insulating film 13. The circumference wiring CNC is formed of the same material as the gate line G, etc.

At least, a portion of the circumference wiring CNB is exposed without being covered with the insulating film. The circumference wiring CNB is located in the aperture AP in a position outside the substrate end CTE in order to improve reworking tolerance. That is, the circumference wiring CNB is formed on the etching stopper layer ES in the aperture AP, and extends on the third insulating film 13 crossing the edge E1. In the illustrated example, the circumference wiring CNB intersects the circumference wiring CNC through the third insulating film 13. The circumference wiring CNB is formed of the same material as the source line S, etc. The substrate end CTE counters the position where the circumference wiring CNB runs aground on the third insulating film 13.

Inside the substrate end CTE (active area side), since the circumference wiring CNB is located on the third insulating film 13, the circumference wiring CNB needs to cross the edge E1 of the aperture AP. In the edge E1, the film thickness of the circumference wiring CNB tends to become thin locally. At the worst, the circumference wiring CNB may break off, and disconnection thereof may arise. Larger a step between the surface of the etching stopper layer ES and the upper surface of the third insulating film 13 becomes, and steeper the inclination of the edge E1 becomes, thinner the film thickness of the circumference wiring CNB which crosses the edge E1 becomes easily, and it also becomes easy to generate the disconnection thereof.

According to this embodiment, the edge E1 is formed in a comb-like shape. The circumference wiring CNB extends on the edge E1 so that the circumference wiring CNB covers at least one concave portion CC and one convex portion CV, respectively. For this reason, without expanding the width of the aperture AP or the circumference wiring CNB (length in the first direction X), the total extending distance of the portion which the circumference wiring CNB covers the edge E1 can be made long, and it becomes possible to suppress the disconnection.

Moreover, according to this embodiment, since it is not necessary to expand the width of the aperture AP or the circumference wiring CNB, high definition can be achieved, and the flexibility of a layout can be also achieved.

Moreover, since the film thickness of the portion which covers the edge E1 of the circumference wiring CNB is fully securable according to this embodiment, even if the circumference wiring CNB is charged under the influence of static electricity, it becomes possible to control generating of the disconnection by the electrostatic discharge in the portion which covers the edge E1.

On the other hand, in the manufacturing process for forming the circumference wiring CNB, when forming a film using wiring material, the film may be formed in a state in which the wiring material is oriented. When forming the film using the wiring material on a stepped portion, in case the edge E1 is formed along only the first direction X, i.e., the edge is formed in the line shape, the film thickness formed of the wiring material on the edge E1 may become thin under the influence of the orientation characteristics of the wiring material at the time of film forming.

According to this embodiment, the circumference wiring CNB covers the end sides of the edge E1 in the plurality directions by making the edge E1 in the nonlinear shape. In the example shown in FIG. 3, if its attention is paid to the convex portion CV of the edge E1, the convex portion CV includes the end sides S1 to S3 which face in the three directions, respectively. The circumference wiring CNB covers all of the end sides S1 to S3 in the three directions. That is, in the process for manufacturing the circumference wiring CNB, when forming the film by wiring material, the influence by the orientation characteristics of the wiring material is eased. For this reason, even if film thickness may become thin locally in the circumference wiring CNB which covers the edge E1, it is possible to form the film with sufficient film thickness at other locations, and it is also possible to control generating of the disconnection. Therefore, it becomes possible to control the fall of the manufacturing yield.

An example of a size of the panel PNL is described below. The width W1 in the first direction X of the aperture AP is 155 μm, and the width W2 in the first direction X of the circumference wiring CNB is smaller than the width W1, and 150 μm. The interval between the circumference wiring CNB and the edge E2, and the interval between the circumference wiring CNB and the edge E3 are 2.5 μm, respectively. In the edge E1, the cycle "a" in the first direction X of the concave-convex is 30 μm, and the depth "b" of the concave portion CC in the second direction Y (or height of convex portion CV) is 100 μm. The depth of the aperture AP, i.e., height from the surface of the etching stopper layer ES to the upper surface of the third insulating film 13 is 600 nm-700 nm, and the film thickness of the circumference wiring CNB is approximately 300 nm.

Next, other embodiments are explained.

Figure 5:
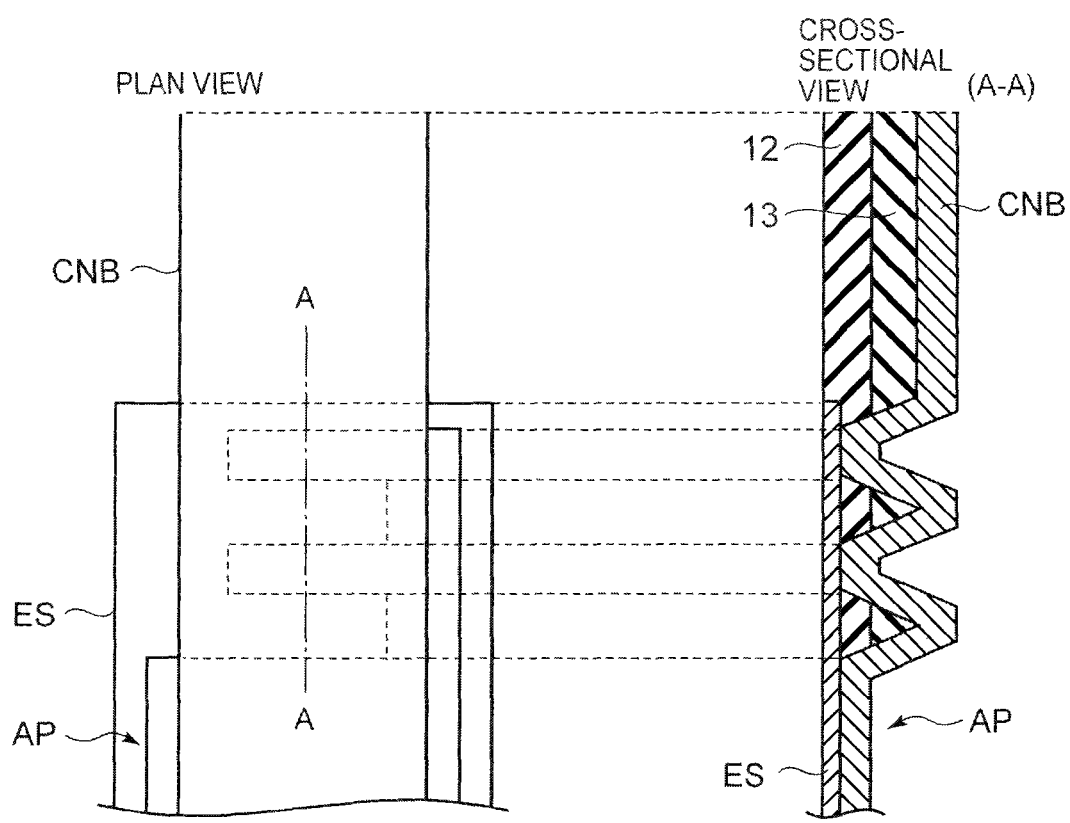
FIG. 5 is a plan view and a cross-sectional view schematically showing the structure of the peripheral area in the display panel PNL shown in FIG. 1 according to a second embodiment.

FIG. 5 is a plan view schematically showing the structure of the peripheral area in the display panel PNL shown in FIG. 1 according to a second embodiment.

The embodiment shown in FIG. 5 is different as compared with the embodiment shown in FIG. 3 and FIG. 4 in that the direction of the concave portion CC and the convex portion CV which forms the edge E1 differs each other. That is, the concave portion CC and the convex portion CV are formed with a cycle "a" along the second direction Y, and the concave portion CC (or convex portion CV) has the depth "b" in the first direction X.

Also in this second embodiment, the same effect as the above-mentioned first embodiment is acquired.

In addition, in the above embodiment, one example in which the edge E1 is formed in the com-like shape having rectangular projections is explained as the non-linear shape. However, the convex portion and the concave portion may be formed in the comb-like shape having projections in other polygonal shape (triangle, etc.), or in a sine wave shape (curve shape), respectively. Even if the edge E1 is formed with any shapes, the circumference wiring CNB is arranged so that the circumference wiring CNB covers at least one convex portion and one concave portion, respectively. That is, the edge E1 may be formed so as to have not only a plurality of convex portions and concave portions, but also one convex portion and one concave portion, respectively. In this case, the circumference wiring CNB is arranged so that the circumference wiring CNB covers one convex portion and one concave portion. The edge E1 in the non-liner shape means the edge having at least one convex portion and one concave portion, respectively.

Figure 6:
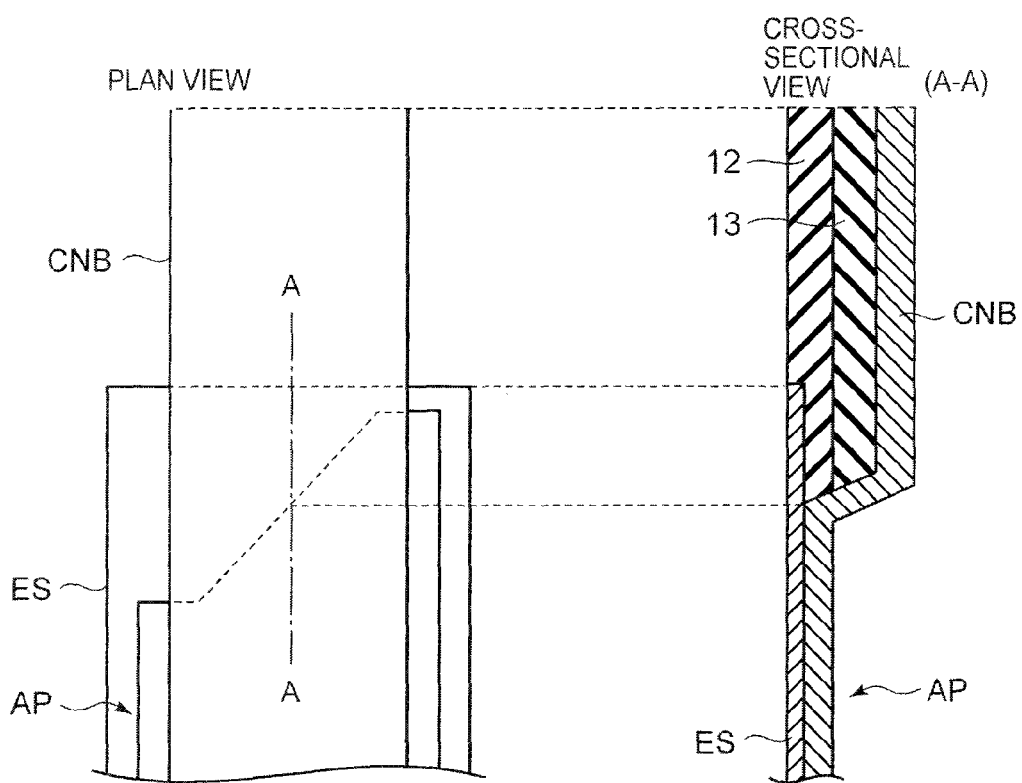
FIG. 6 is a plan view and a cross-sectional view schematically showing the structure of the peripheral area in the display panel PNL shown in FIG. 1 according to a third embodiment.

FIG. 6 is a plan view schematically showing the structure of the peripheral area in the display panel PNL shown in FIG. 1 according to a third embodiment.

The embodiment shown in FIG. 6 is different from the embodiment shown in FIGS. 3 and 4 in that the edge E1 extends in a different direction from both the extending direction (second direction Y) of the circumference wiring CNB and the direction (the first direction X) crossing the extending direction of the circumference wiring CNB orthogonally. That is, the edge E1 is formed in an oblique line shape extending in an oblique direction crossing the first direction X and the second direction Y, respectively.

Also in the third embodiment, as compared with the case in which the edge E1 is formed in the shape of the line along the first direction X, the total extending portion of the circumference wiring CNB which covers the edge E1 can be extend, and the same effect as the above embodiments is acquired.

As explained above, according to the embodiments, the circuit board and display device using the circuit board which can control the fall of the manufacturing yield can be supplied.

While certain embodiments have been described, these embodiments have been presented by way of embodiment only, and are not intended to limit the scope of the inventions. In practice, the structural elements can be modified without departing from the spirit of the invention. Various embodiments can be made by properly combining the structural elements disclosed in the embodiments. For embodiment, some structural elements may be omitted from all the structural elements disclosed in the embodiments. Furthermore, the structural elements in different embodiments may properly be combined. The accompanying claims and their equivalents are intended to cover such forms or modifications as would fall within the scope and spirit of the inventions.

What is claimed is:

1. An array substrate, comprising:
   a first insulating film extending from an active area for displaying images to a peripheral area surrounding the active area;
   a gate line formed on the first insulating film in the active area;
   a second insulating film covering the first insulating film and the gate line;
   a source line formed on the second insulating film in the active area; and
   a circumference wiring arranged in an aperture penetrating the first and second insulating films and extending from the aperture to the active area on the second insulating film so as to cross an edge of the aperture in the peripheral area;
   wherein
   the circumference wiring is formed of the same material as the source line, and
   the edge of the aperture which the circumference wiring crosses includes at least one concave portion and one convex portion, respectively.

2. The array substrate according to claim 1, wherein the edge is formed in a comb-like shape.

3. The array substrate according to claim 1, wherein the first insulating film or the second insulating film is formed of silicon-oxide or silicon-nitride, and an etching stopper layer formed of a semiconductor layer is arranged in a bottom portion of the aperture.

4. The array substrate according to claim 2, wherein the edge is formed in the comb-like shape having protrusions of a polygonal shape.

5. The array substrate according to claim 4, wherein the polygonal shape is a triangular shape.

6. The array substrate according to claim 2, wherein the comb-like shape is formed in a sine curve shape.

7. An array substrate, comprising:
a first insulating film extending from an active area for displaying images to a peripheral area surrounding the active area;
a gate line formed on the first insulating film in the active area;
a second insulating film covering the first insulating film and the gate line;
a source line formed on the second insulating film in the active area; and
a circumference wiring arranged in an aperture penetrating the first and second insulating films and extending from the aperture to the active area on the second insulating film crossing an edge of the aperture in the peripheral area;
wherein
the circumference wiring is formed of the same material as the source line, and
the edge of the aperture which the circumference wiring crosses is formed so as to extend in a different direction from both an extending direction of the circumference wiring and a direction crossing the extending direction of the circumference wiring orthogonally.

8. The array substrate according to claim 7, wherein the edge of the aperture which the circumference wiring crosses is formed in an oblique shape extending in an oblique direction crossing a first direction and a second direction orthogonally crossing the first direction.

9. The array substrate according to claim 7, wherein the first insulating film or the second insulating film is formed of silicon-oxide or silicon-nitride, and an etching stopper layer formed of a semiconductor layer is arranged in a bottom portion of the aperture.

10. A display device, comprising:
a circuit board including:
a first inter-layer insulating film extending from an active area for displaying images to a peripheral area surrounding the active area,
a gate line formed on the first inter-layer insulating film in the active area,
a second inter-layer insulating film covering the first inter-layer insulating film and the gate line,
a source line formed on the second inter-layer insulating film in the active area, and
a circumference wiring arranged in an aperture penetrating the first and second inter-insulating films and extending from the aperture to the active area on the second inter-layer insulating film so as to cross an edge of the aperture, and
a counter substrate facing the circuit board and including a substrate end located in a position where the circumference wiring cross the edge of the aperture;
wherein the shape of the edge of the aperture which the circumference wiring crosses includes at least one concave portion and one convex portion, respectively.

11. The display device according to claim 10, wherein the edge is formed in a comb-like shape.

12. The display device according to claim 10, wherein the first inter-layer insulating film or the second inter-layer insulating film is formed of silicon-oxide or silicon-nitride, and
an etching stopper layer formed of a semiconductor layer is arranged in a bottom portion of the aperture.

13. The display device according to claim 11, wherein the edge is formed in the comb-like shape having protrusions of a polygonal shape.

14. The display device according to claim 13, wherein the polygonal shape is a triangular shape.

15. The display device according to claim 11, wherein the comb-like shape is formed in a sine curve shape.

* * * * *